United States Patent [19]

Calligaro et al.

[11] Patent Number: 5,546,044
[45] Date of Patent: Aug. 13, 1996

[54] VOLTAGE GENERATOR CIRCUIT PROVIDING POTENTIALS OF OPPOSITE POLARITY

[75] Inventors: Cristiano Calligaro, Pavia; Roberto Gastaldi, Milan; Piero Malcovati; Guido Torelli, both of Pavia, all of Italy

[73] Assignee: SGS-Thomson Microelectronics S.r.l., Milano, Italy

[21] Appl. No.: 311,941

[22] Filed: Sep. 26, 1994

[30] Foreign Application Priority Data

Sep. 30, 1993 [EP] European Pat. Off. .............. 93830403

[51] Int. Cl.⁶ ..................................................... G05F 1/10
[52] U.S. Cl. .......................... 327/543; 327/535; 327/537; 327/538; 327/541
[58] Field of Search .................................... 327/534, 535, 327/536, 538, 540, 537, 541, 543

[56] References Cited

U.S. PATENT DOCUMENTS

| | | | |
|---|---|---|---|
| 4,405,868 | 9/1983 | Lockwood | 327/544 |
| 4,407,259 | 10/1983 | Abo | 123/638 |
| 4,633,106 | 12/1986 | Backes et al. | 327/536 |
| 4,769,784 | 9/1988 | Doluca et al. | 327/537 |
| 5,034,625 | 7/1991 | Min et al. | 327/537 |
| 5,072,134 | 12/1991 | Min | 327/537 |
| 5,216,588 | 6/1993 | Bajwa et al. | 363/60 |
| 5,247,208 | 9/1993 | Nakayama | 327/534 |
| 5,304,859 | 4/1994 | Arimoto | 327/535 |

Primary Examiner—Terry Cunningham
Attorney, Agent, or Firm—David V. Carlson; Bryan A. Santarelli; Seed and Berry LLP

[57] ABSTRACT

A circuit for generating positive and negative boosted voltages, comprising first and second voltage booster circuits, respectively for positive and negative voltages, which have output terminals interconnected at a common node. It comprises two tristate logic gate circuits for coupling said voltage booster circuits to a positive supply voltage generator and additional tristate logic gate circuits for driving the phases of charge pump circuits incorporated into the booster circuits. This voltage generating circuit may be integrated in single-well CMOS technology.

13 Claims, 2 Drawing Sheets

VOLTAGE GENERATOR CIRCUIT PROVIDING POTENTIALS OF OPPOSITE POLARITY

TECHNICAL FIELD

This invention relates to monolithically integratable voltage booster circuits.

BACKGROUND OF THE INVENTION

With conventional non-volatile memories, a known cell write technique is that of applying, to the cell drain terminal, a voltage having a moderately high value (e.g., 6.5 Volts), while a higher voltage value (e.g., 10.5 Volts) is applied to its gate.

To erase a cell, on the other hand, a high voltage (e.g., 10.5 Volts) is applied to the source terminal of the cell, while its control gate terminal is held at ground potential.

Such erasing is usually carried out simultaneously on all the cells of a device or all the cells in a memory block ("erasing by sectors").

All the high-voltage references needed for proper operation of a memory are conveniently generated, moreover, within the device from the standard external supply voltage (5 Volts). It should not be overlooked, however, that during the erasing phase, current flow occurs between the cell sources and the substrate; while this is quite small (about 1 µA) for an individual cell, the overall current would be fairly high in the instance of a large storage capacity device, making it difficult to provide a voltage booster within the integrated circuit which can drive the source electrodes during that operation phase. Furthermore, the application of a high reverse bias between the cell sources and the substrate may introduce reliability problems in that voltages close to the junction breakdown voltage may be reached and hot holes may be generated which become trapped at or within the gate dielectric (e.g., an oxide).

It is for the above-outlined reasons that an alternative memory erasing technique has been developed whereby the source electrodes of the cells are held at a relatively low positive voltage (e.g., 5 Volts), while a negative voltage of adequate value (approximately −10.5 Volts) is applied to the gate electrodes. The circuit which generates this voltage is not required to supply a large current, so that it can be provided internal to the integrated storage circuit.

Thus, in more recently developed storage cell devices—such as "flash" devices—implemented with field-effect transistors, a high positive or negative voltage, relative to a reference potential, is applied at the programming stage to the gate terminal of each storage cell, depending respectively on whether the involved phase is a write or an erase phase.

In circuit solutions currently in use to implement that technique, the positive or negative boosted voltages for driving the storage cells during the write and erase phases are applied to the gate terminals through suitable selection transistors with switch functions. However, driving the storage cells through their gate terminals poses a major problem from the wide variation in value of the voltages and their polarities.

A variation of 21 Volts, at the above-mentioned voltage values, would require use of "high-voltage" transistors and incorporation of a number of circuit configurations to prevent undesired leakage or breakdown of parasitic diodes in the integrated circuit.

Also, due to problems from charge injection, selection transistors cannot be used where a single-well integration process in CMOS technology is employed.

SUMMARY OF THE INVENTION

The underlying technical problem solved by this invention is to provide a circuit which can generate both positive and negative boosted voltages to drive storage cells through their control gate terminals, which affords a broader choice of integration techniques and improved reliability, for a device incorporating the present invention.

The present invention provides a circuit effective to generate both positive and negative boosted voltages for driving circuit nodes in circuits adapted for monolithic integration in CMOS technology. A specific application of the invention is related to devices which include non-volatile storage cells.

The features and advantages of a negative and positive boosted voltage generating circuit according to the invention will be apparent from the following description of an embodiment thereof, given by way of example and not of limitation with reference to the accompanying drawings.

DETAILED DESCRIPTION OF THE INVENTION

Figure 1:
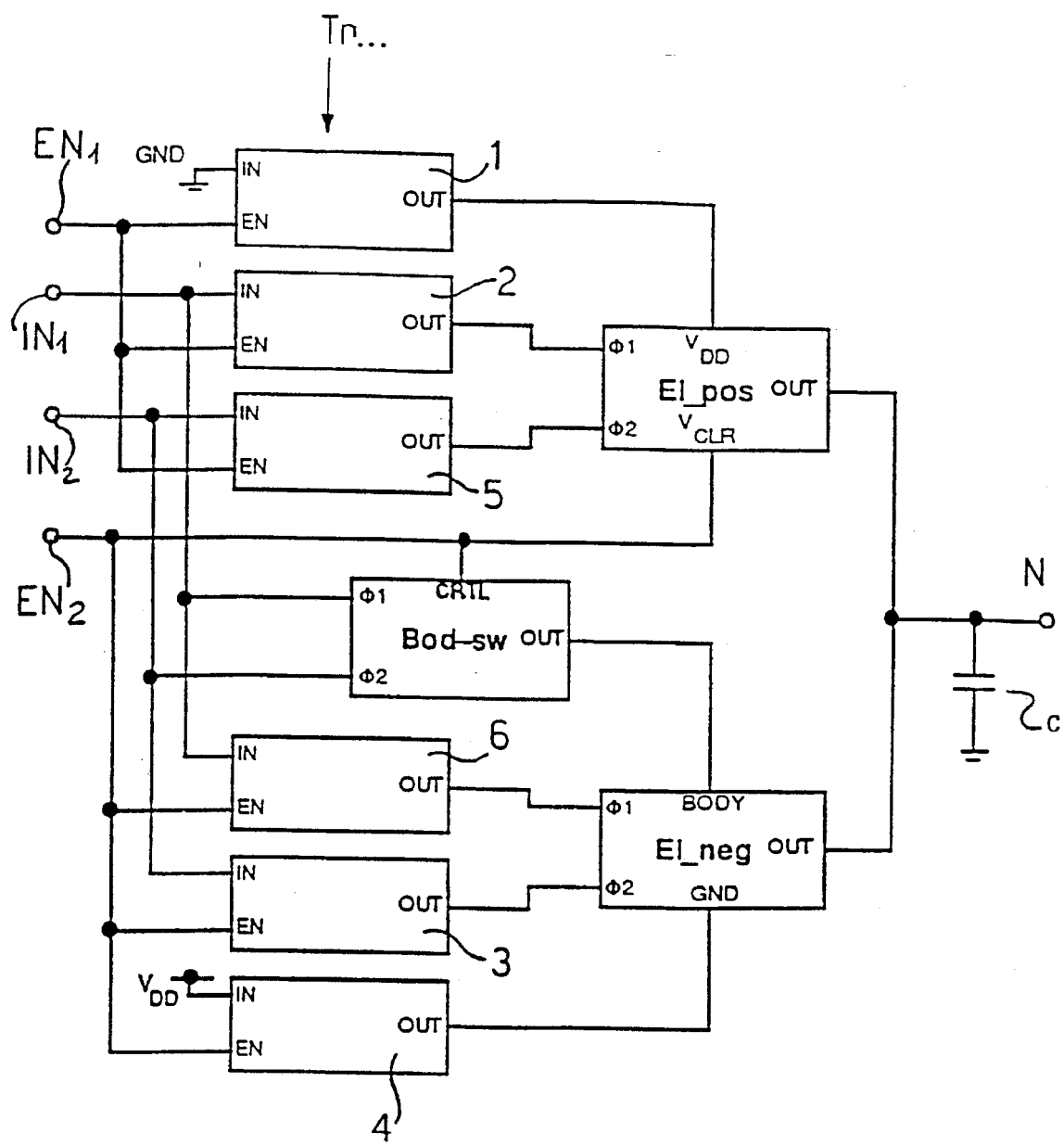
FIG. 1 is a block diagram of a positive and negative boosted voltage generating circuit according to the invention.

The block diagram for a positive and negative boosted voltage generating circuit according to the invention, shown in FIG. 1, comprises first Tr1, second Tr2, third Tr3, fourth Tr4, fifth Tr5 and sixth Tr6 switching circuits, each having an input terminal IN, an output terminal OUT, and an enable terminal EN.

In a preferred embodiment of a voltage generating circuit according to the invention, such switching circuits Tr1 through Tr6 are implemented as tristate logic gate circuits, in forms known from the pertinent prior art.

The block diagram of FIG. 1 further includes a first voltage booster circuit El__pos and a second voltage booster circuit, El__neg, for respective positive and negative voltages, each having first and second command terminals φ1 and φ2 and an output terminal OUT, wherein said first and second voltage booster have a voltage supply terminal Vdd and GND, respectively.

The voltage booster circuits El__pos and El__neg mentioned above are preferably embodied by charge pump circuits that include transistors implemented in CMOS technology, and the two command terminals φ1 and φ2 allow the charge phases to be controlled.

Figure 2:
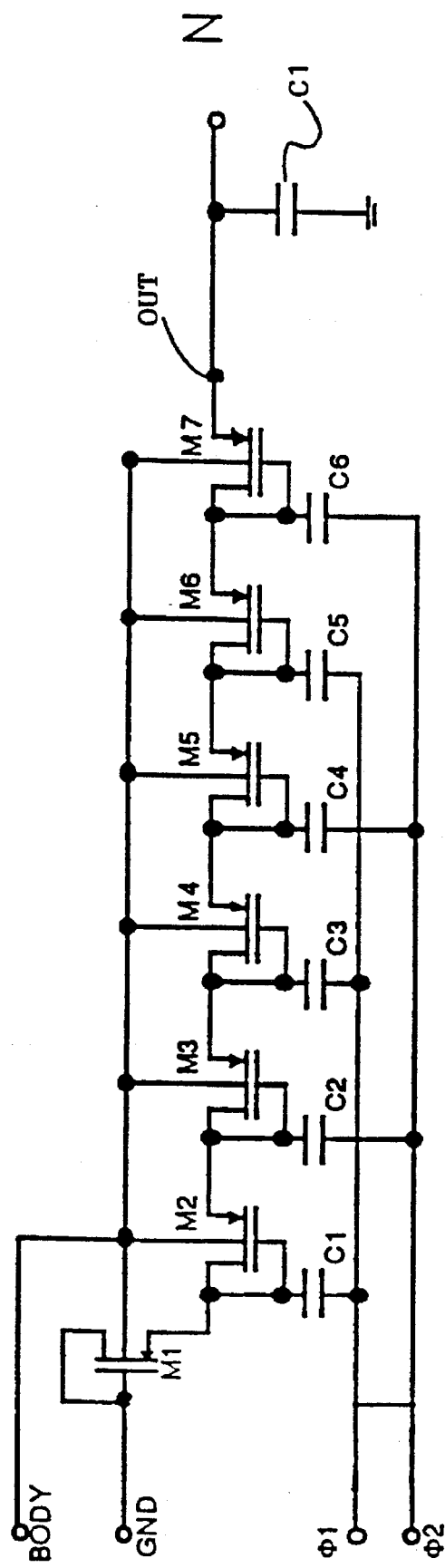
FIG. 2 shows a circuit diagram for a negative voltage booster circuit of the charge pump type, which can be incorporated into a voltage generating circuit according to the invention.
Figure 2:
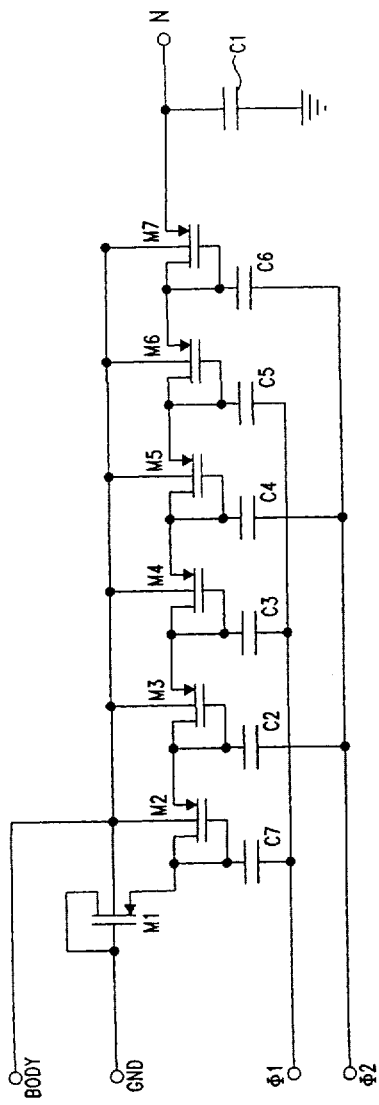

A preferred practical example of a negative voltage booster circuit El__neg is depicted in FIG. 2. As exemplified by FIG. 2, the charge pump circuits preferably include a plurality of diode-capacitor voltage multiplier pump units connected in parallel with respect to each other. The plurality of pump units are switched at different times by means of the two command terminals φ1 and φ2. The positive voltage booster circuit El__pos is preferably in a similar construction to that depicted in FIG. 2, except that the positive voltage booster circuit El_pos is preferably coupled to the voltage supply terminal Vdd and produces a boosted positive voltage while the negative voltage booster circuit El_neg produces a boosted negative voltage.

Referring back to FIG. 1, according to the invention, the output terminals OUT of the two voltage booster circuits El_pos and El_neg are directly connected together at a circuit node N which is driven thereby through positive and negative voltages having higher absolute values than a positive supply voltage for the present invention. The values of the generated voltages are typically +10.5 Volts and −10.5 Volts, for a supply voltage of +5 Volts.

In the power supply (not shown), which is exclusive with non-volatile storage cell CMOS technology devices, the control gate terminals of the storage cells are coupled to the circuit node N.

In the preferred embodiment of a circuit for generating positive and negative voltages, according to the invention, the circuit includes a third voltage booster circuit, identified by a block Bod_sw in FIG. 1, which allows the substrate of the CMOS transistors used for the charge pump of the negative voltage booster circuit El_neg to be suitably biased.

The voltage booster circuit Bod_sw has first and second command terminals φ1 and φ2 for controlling the phases of the charge pump circuit therein, and an output terminal OUT connected to a BODY terminal for biasing the bodies of the transistors in the charge pump circuit of the negative voltage booster circuit El_neg. The BODY terminal is preferably connected to the substrate of the CMOS transistors used for the charge pump at the negative voltage booster circuit El_neg.

The voltage booster circuit Bod_sw generates positive voltages which are controlled at predetermined levels by means of a control terminal CRLT.

The positive voltage booster circuit El_pos also has a charge reset command terminal CLR which is preferably coupled to the control terminal CRLT in parallel therewith.

The input terminals of the switching circuits Tr1 and Tr4 are respectively connected to a ground GND and a supply terminal Vdd. It should be noted that for the two switching circuits Tr1 and Tr4, the inverting tristate circuit is the preferred embodiment in this case, it being understood that this circuit may also be used for the others.

The input terminals of the switching circuits Tr2 and Tr6 are connected together at a first common input node IN1, to which the first command terminal φ1 of the voltage booster circuit Bod_sw is also connected. The input terminals of the switching circuits Tr3 and Tr5 are connected together at a second common input node IN2, to which the second command terminal φ2 of the circuit Bod_sw is also connected.

The enable terminals of the switching circuits Tr1, Tr2 and Tr5 are connected together at a first common enable node EN1. The enable terminals of the switching circuits Tr3, Tr4 and Tr6, the control terminal CRTL of the voltage booster circuit Bod_sw, and the charge reset command terminal CLR of the positive voltage booster circuit El_pos are connected together at a second common enable circuit node EN2.

The common node links specified herein are useful for signal synchronizations but are not a strict requirement, and the several terminals of the blocks could be disconnected from one another, or be coupled together by other circuit arrangements, in accordance with design techniques known to skilled persons in the art.

The output terminals of the switching circuits Tr1, Tr2 and Tr5 are respectively connected to the supply terminal $V_{DD}$ and the first and second command terminals φ1 and φ2 of the positive voltage booster circuit El-pos.

The output terminals of the switching circuits Tr6, Tr3 and Tr4 are respectively connected to the first and the second command terminals φ1 and φ2, and the ground GND, of the negative voltage booster circuit El_neg.

As previously mentioned, at the programming stage, either a positive voltage or a negative voltage should be applied to the gate terminal of each storage cell depending on the programming, writing or erasing requirements. In FIG. 1 the storage cells' load is represented by a capacitor C1.

In operation, each voltage booster circuit output at an appropriate target voltage value or allow its negative output to attain the voltage value as defined by other driver circuits, such as the other voltage booster circuit to which it is connected. The voltage booster circuit El_pos, for example, should impress on its output a voltage of 10.5 Volts when requested, and allow the output to attain −10.5 Volts when the circuit node N is to be controlled by the voltage booster circuit El_neg.

In accordance with this invention, a novel circuit arrangement is presented which can provide this driver function. A fundamental aspect of this arrangement is that the outputs of both voltage booster circuits, i.e., both the positive voltage generating circuit El_pos and the negative voltage generating circuit El_neg, are held at all times connected to the load, which load is represented generally by the gate capacitance C1 of the storage cells to be driven. Whenever a booster circuit is required to output no boosted voltage, it is disabled internally such that its output is allowed to float, thereby leaving the other booster circuit free to take over in common output node control.

In the specific instance of voltage booster circuits which are operated in the charge pump mode, as one voltage booster circuit is disabled, its charge pump is isolated from the supply (Vdd for El_pos, GND for El_neg) and the switching circuits via the charge pump phase terminals φ1 and φ2. In this way, the output of the disabled booster will be allowed to float so that it can follow the voltage impressed by the actuated drive circuitry (specifically, the other voltage booster circuit) without disturbing its normal operation. Of course, the enablement of one circuit causes its charge pump to be both connected to its respective supply and the charge driving phase generator.

The booster circuits are connected to or disconnected from a suitable supply and the driving phases through tristate circuits. These may be embodied conventionally, and each of the tristate circuits functions as an inverter when enabled (EN=1), and exhibits a high output impedance when disabled (EN=0).

The voltage booster circuit El_pos includes, according to the invention, a p-channel output transistor whose gate is connected to ground. This transistor would be turned automatically on, with the booster circuit El_pos operative and the booster circuit El_neg disabled (in fact, the voltages at both the source and drain terminals are positive), and off with El_neg enabled and El_pos disabled (the voltage at the source terminal is null and that at the drain terminal is negative). By providing this output transistor, the positive voltage generated by the booster circuit El_pos can be transferred to the output mode N (which is then coupled to the control gate terminals of the storage cells) upon El_pos being enabled, and the negative voltage impressed on the node N by the booster circuit El_neg can be passed to the booster circuit El_pos upon the latter being disabled. The last-mentioned aspect is important in preventing the source electrodes of the n-channel transistors, connected to the output of the booster El_pos, from being forward biased with respect to the substrate, which is p-doped and connected to ground; otherwise, the charge from the booster circuit El_neg would be drained to the substrate, so that the node N cannot be pulled to the negative voltage required and problems from carrier injection into the substrate may be experienced.

The fact that the booster circuit El_pos is disabled while the booster circuit El_neg is enabled (the supply $V_{DD}$ and the drive inputs $\phi 1$ and $\phi 2$ of the charge pumps are isolated) prevents a voltage in excess of 20 Volts from being applied between the drain and the source of the output transistor (possibly causing reliability problems), and avoids power waste.

As for the negative voltage booster El_neg, of which FIG. 2 shows an embodiment, it should be emphasized that the source areas of the p-channel transistors comprising it are forward biased with respect to the body regions of the transistors when the booster circuit El_neg is disabled and the voltage at the node N brought to positive values. (This would, in a similar manner to that described above for the booster circuit El_pos, cause the charge supplied by the booster circuit El_pos to be drained off.) To this aim, the arrangement proposed herein provides, under the conditions described herein, for the body electrode of the p-channel transistors of the booster El_pos to be connected to a voltage which is the equal of or higher than the voltage generated by the booster El_pos. This voltage may be obtained at the device through an appropriate booster circuit Bod_sw, as shown in FIG. 1.

It is convenient that upon enablement of the booster circuit El_neg, the body electrode of the p-channel transistors shown in FIG. 2 not be connected to an excessively high voltage, so that an excessive body effect on the threshold of the transistors is avoided and the effectiveness of the charge pump circuits maintained; this measure has the added advantage that the application of an excessively high voltage across the junction between the source and the body of transistors M7 and M1 of the negative booster can be prevented.

The booster circuit Bod_sw can generate a voltage having an adequate value to drive said body electrodes to either states (booster circuit El_neg enabled or disabled). The booster circuit Bod_sw will generate a voltage of about 14.5 Volts with the booster circuit El_pos enabled, and generate a voltage of about 4.5 Volts with the latter disabled and the booster circuit El_neg enabled. This can be accomplished by means of conventional circuit arrangements.

With the booster circuits El_pos and El_neg enabled and disabled, respectively, both the drain of the first charge pump transistor of the negative booster circuit El_neg (M1, M8 in FIG. 2; thereby denying an escape path to the charge from the positive booster) and the electrodes of the phase charge pump $\phi 1$ and $\phi 2$ (thereby avoiding unnecessary increase of the capacitive load as seen from the positive booster circuit) are allowed to float.

The net result of all this is that the booster circuit El_pos supplies 10.5 Volts, the booster circuit El_neg is disabled through the tristate circuits such that its output will float and the bodies of its transistors are brought to 14.5 Volts; on the other hand, when the negative booster supplies −10.5 Volts, the bodies of its transistors are brought to 4.5 Volts and the positive booster El_pos is disabled (through the tristate blocks) such that its output will be floating.

The arrangement presented herein requires appropriate circuit arrangements for it to be effective. The considerations herein apply to booster circuits as integrated in CMOS technology with a p-doped substrate. It will be appreciated that the same considerations would also apply, with appropriate adaptations, to boosters integrated in CMOS technology with an n-doped substrate.

The circuit solutions proposed herein relate to the instance of booster circuits which operate on the charge pump principle. However, the proposed arrangement (i.e., the arrangement having continued connection of both the output of the positive voltage booster circuit El_pos and the output of the negative voltage booster circuit El_neg to the load to be driven, with "internal" deactuation of either booster, such that its output will be floating while the other booster is operative) is also applicable to boosters which are operated on different techniques.

From the foregoing, those skilled in the art will appreciate that, although embodiments of the invention have been described herein for purposes of illustration, various equivalent modifications may be made without departing from the spirit and scope of the invention. Accordingly, the invention is not limited except by the appended claims.

We claim:

1. A circuit for generating voltages with first and second polarities relative to a reference potential, which voltages are boosted in absolute value over the reference potential, characterized in that the circuit comprises:

first, second, third, fourth, fifth, and sixth switching circuits each having an input terminal, an output terminal, and an enable terminal, the input terminals of the first and the fourth switching circuits respectively connected to a first terminal and a second terminal of a supply voltage generator, the input terminals of the second and sixth switching circuits connected to a first input signal, the input terminals of the third and fifth switching circuits coupled to a second input signal, the enable terminals of the first, second, and fifth switching circuits connected to a first enable signal, and the enable terminals of the third, fourth, and sixth switching circuits connected to a second enable signal;

first and second voltage booster circuits for respectively generating voltages of the first polarity and voltages of the second polarity, each booster circuit having first and second command terminals, a supply terminal, and an output terminal, the second booster circuit having a bias terminal the output terminals of the first and the second voltage booster circuits being connected together at a common output node, the supply terminal, the first command terminal, and the second command terminal of the first voltage booster circuit respectively connected to the output terminals of the first, second, and fifth switching circuits, the supply terminal, the first command terminal, and the second command terminal of the second voltage booster circuit respectively connected to the output terminals of the fourth, sixth, and third switching circuits; and a third voltage booster circuit for generating voltages of the first polarity type which can be set at predetermined levels, the third booster circuit having first and second command terminals respectively connected to the first and second input signals, a control terminal connected to the second enable signal, and an output terminal connected to the bias terminal of the second voltage booster circuit.

2. A voltage generating circuit according to claim 1, characterized in that at least one of the switching circuits comprises a tristate logic gate circuit.

3. A voltage generating circuit according to claim 1, characterized in that the first voltage booster circuit has an electric charge reset command terminal connected to the second enable signal.

4. A voltage generating circuit according to claim 1, characterized in that the third voltage booster circuit comprises a charge pump circuit that is driven through the first and the second command terminals of the third booster circuit.

5. A voltage generating circuit according to claim 1, characterized in that the first voltage booster comprises a field-effect final transistor having an output terminal connected to the common output node and a gate terminal connected to the supply terminal of the first voltage booster.

6. A voltage generating circuit according to claim 1, characterized in that the second voltage booster circuit comprises field-effect transistors having body bias terminals connected to the bias terminal of the second voltage booster.

7. A voltage generating circuit comprising:

a positive voltage boosting circuit operable to selectively provide a boosted positive voltage signal to an output node, the positive boosting circuit having first and second command terminals respectively coupled to first and second command signals, a supply terminal coupled to a first supply signal, a reset terminal coupled to a first enable signal, and an output terminal coupled to the output node;

a negative voltage booster circuit operable to selectively provide a boosted negative voltage signal to the output node, the negative booster circuit having a supply terminal coupled to a second supply signal, first and second command terminals respectively coupled to third and fourth command signals, a body terminal, and an output terminal coupled to the output node;

a voltage generating circuit operable to generate a body signal at an output terminal that is coupled to the body terminal, the generating circuit having first and second command terminals respectively coupled to first and second input signals, and a control terminal coupled to the first enable signal; and a switching bank that is coupled to the positive and negative voltage booster circuits and said first and second input signals, said first enable signal and a second enable signal, and first and second supply voltage nodes, the switches operable to generate the first, second, third, and fourth command signals and the first and second supply signals such that one of the positive and negative voltage booster circuits provides the corresponding boosted positive and negative voltage signals to the output node, while the other voltage booster circuit floats electrically with respect to the output node.

8. The voltage generating circuit of claim 7 wherein the switching bank decouples the other voltage booster circuit from the respective first and second supply signals to allow the other booster circuit to float electrically.

9. The voltage generating circuit of claim 7 wherein the switching bank further comprises:

a first switching circuit having an enable terminal coupled to the second enable signal, an output terminal coupled to the supply terminal of the positive booster circuit, and an input terminal coupled to the first supply voltage node;

a second switching circuit having an enable terminal coupled to the first enable signal, an output terminal coupled to the supply terminal of the negative booster circuit, and an input terminal coupled to the second supply voltage node; and wherein the first and second switching circuits are operable to selectively couple the positive and negative voltage booster circuits to the first and second voltage supply nodes respectively in response to the second and first enable signals.

10. The voltage generating circuit of claim 9 wherein the first and second switching circuits are tristate logic circuits.

11. The voltage generating circuit of claim 9 further comprising:

a third switching circuit having an input terminal coupled to the first input signal, an enable terminal coupled to the second enable signal, and an output terminal coupled to the first command terminal of the positive voltage boosting circuit;

a fourth switching circuit having an input terminal coupled to the first input signal, an enable terminal coupled to the first enable signal, and an output terminal coupled to the first command terminal of the negative voltage booster circuit; and wherein the third and fourth switching circuits are operable to selectively couple the positive and negative voltage booster circuits to the first input signal in response to the second and first enable signals respectively.

12. The voltage generating circuit of claim 11, further comprising:

a fifth switching circuit having an input terminal coupled to the second input signal, an enable terminal coupled to the second enable signal, and an output terminal coupled to the second command terminal of the positive voltage boosting circuit;

a sixth switching circuit having an input terminal coupled to the second input signal, an enable terminal coupled to the first enable signal, and an output terminal coupled to the second command terminal of the negative voltage booster circuit; and wherein the fifth and sixth switching circuits are operable to selectively couple the positive and negative voltage booster circuits to the second input signal in response to the second and first enable signals respectively.

13. The voltage generating circuit of claim 7 wherein the positive and negative voltage booster circuits are monolithically integrated in a semiconductor device.

* * * * *

UNITED STATES PATENT AND TRADEMARK OFFICE
CERTIFICATE OF CORRECTION

Page 1 of 2

PATENT NO. : 5,546,044
DATED : August 13, 1996
INVENTOR(S) : Cristiano Calligaro, Roberto Gastaldi, Piero Malcovati, Guido Torelli It is certified that error appears in the above-identified patent and that said Letters Patent is hereby corrected as shown below:

In the figures, under sheet 2 of 2, please delete in its entirety FIG. 2, and insert therefor the attached revised FIG. 2.

Signed and Sealed this

Third Day of November, 1998

Attest:

BRUCE LEHMAN

Attesting Officer

Commissioner of Patents and Trademarks